United States Patent
Nagaoka et al.

(10) Patent No.: US 7,030,727 B2
(45) Date of Patent: Apr. 18, 2006

(54) HIGH VOLTAGE VARIABLE RESISTOR DEVICE

(75) Inventors: Tsugunichi Nagaoka, Otsu (JP); Yasuhiko Shimanaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/015,587

(22) Filed: Dec. 17, 2004

(65) Prior Publication Data

US 2005/0206495 A1    Sep. 22, 2005

(30) Foreign Application Priority Data

Mar. 19, 2004 (JP) .............................. 2004-080960

(51) Int. Cl.
*H01C 10/30* (2006.01)

(52) U.S. Cl. ....................................... 338/160; 338/162

(58) Field of Classification Search ................ 338/160, 338/162, 128, 284, 70, 219, 174, 175, 176
See application file for complete search history.

(56) References Cited

U.S. PATENT DOCUMENTS

| | | | | |
|---|---|---|---|---|
| 4,527,147 A | * | 7/1985 | Arakawa | .................... 338/162 |
| 4,631,512 A | * | 12/1986 | Hishiki et al. | ................. 338/48 |
| 5,508,678 A | * | 4/1996 | Tsunezawa et al. | ......... 338/160 |
| 5,721,526 A | * | 2/1998 | Daimon et al. | ............. 338/160 |
| 5,929,745 A | * | 7/1999 | Tsunezawa et al. | ......... 338/160 |
| 2002/0067244 A1 | * | 6/2002 | Shimasaki | .................. 338/162 |

FOREIGN PATENT DOCUMENTS

JP          09-139302        5/1997

* cited by examiner

*Primary Examiner*—Tu Hoang
(74) *Attorney, Agent, or Firm*—Keating & Bennett, LLP

(57) ABSTRACT

A high voltage variable resistor device includes film resistors of fixed divided resistors and a variable divided resistor, fixed resistors, a variable resistor for adjusting focus voltage, and a variable resistor for adjusting screen voltage, which are formed on the surface of an insulation substrate. The fixed divided resistors have a meandering pattern and a high resistance. One end of the fixed divided resistor is connected to a high-voltage input terminal, and the other end is connected to one end of the variable divided resistor. The variable divided resistor has an arc pattern, and its other end is connected to one end of the fixed divided resistor. The other end of the fixed divided resistor is connected to a voltage detection terminal. The fixed divided resistor having a wide width pattern having a low resistance is connected between the voltage detection terminal and a ground terminal.

10 Claims, 8 Drawing Sheets

HIGH VOLTAGE VARIABLE RESISTOR DEVICE

BACKGROUND OF THE INVENTION

1. Field of the Invention

The present invention relates to a high voltage variable resistor device, and, more particularly, to a high voltage variable resistor device preferably used to adjust the focus voltage and the screen voltage of a television receiver.

2. Description of the Related Art

A high voltage variable resistor device is disclosed in Japanese Unexamined Patent Application Publication No. 9-139302. FIG. 6 is an electrical circuit diagram of a high voltage variable resistor device 101. The high voltage variable resistor device 101 directly receives an input voltage from the output terminal of a flyback transformer FBT for supplying an anode voltage to a cathode-ray tube. A series circuit defined by fixed resistors R13 to R16 and variable resistors VR11 and VR12 is connected between an input terminal THV of the high voltage variable resistor device 101 and a ground. Also, the series circuit of the divided resistors R11 and R12 for voltage detection and a capacitor C are each connected therebetween. A focus voltage is output from an intermediate terminal of variable resistor VR11 for adjusting the focus voltage via a fixed resistor R17, and a screen voltage is output from an intermediate terminal of the variable resistor VR12 for adjusting the screen voltage.

The divided resistors R11 and R12 for voltage detection are provided to detect variations of the anode voltage, and the voltage for detection, which is divided at the connection point of the divided resistors R11 and R12 for voltage detection, is fed back to a high-voltage generation source. The voltage for detection is usually set at about $\frac{1}{3000}$ to about $\frac{1}{2000}$ of the anode voltage. The capacitor C is a screen correcting capacitor for correcting the distortion of the screen of the television receiver.

The high voltage variable resistor device 101 has a configuration as shown in FIG. 7. That is, a division wall 110a is provided inside an insulation case 110 made of synthetic resin and having one open surface. An insulation substrate 120 on which the variable resistor VR11 for adjusting the focus voltage, the variable resistor VR12 for adjusting the screen voltage, and other suitable components, are provided is bonded and fixed to one of the housing portions. A fixed resistor 160 provided with the divided resistors R11 and R12 for voltage detection is housed and fixed in the other housing portion.

Although not shown, on the surface of the insulation substrate 120, film resistors of the fixed resistors R13 to R17, the variable resistors VR11 for adjusting the focus voltage, and the variable resistors VR12 for adjusting the screen voltage are disposed. In the front section of the insulation case 110 opposing the insulation substrate 120, a rotation shaft having a slider that slides on the film resistor of each of the variable resistor VR11 for adjusting the focus voltage and the variable resistor VR12 for adjusting the screen voltage is axially supported. That is, the variable resistors VR11 and VR12 are defined by the insulation substrate 120, the rotation shaft having a slider, and other suitable components.

As shown in, for example, FIG. 8, in a fixed resistor 160, the divided resistors R11 and R12 for voltage detection defined by film resistors are provided on the surface of an insulation substrate 161. The divided resistor R11 has a meandering pattern and a trimming pattern 162 in the central section thereof. The divided resistor R12 has a wide width pattern, and its entirety is defined by a trimming pattern. When the fixed resistor 160 is manufactured, the voltage for detection is finely adjusted by changing the division ratio by deleting a portion of the trimming pattern 162 of the divided resistor R11 and a portion of the width wide pattern of the divided resistor R12.

However, in the known high voltage variable resistor device 101, since the divided resistors R11 and R12 for voltage detection are provided in the fixed resistor 160, which is another separate body, there is the problem in that the manufacturing cost is high. Furthermore, the number of types of fixed resistors 160 must be increased for each different division ratio of the divided resistors R11 and R12 for voltage detection, and the manufacture management is complex. In addition, the tolerance of the division ratio of the divided resistors R11 and R12 for voltage detection is only up to ±2%, and a strict tolerance is difficult to maintain.

SUMMARY OF THE INVENTION

To overcome the problems described above, preferred embodiments of the present invention provide a high voltage variable resistor device having a very low manufacturing cost and for which the division ratio can be finely adjusted with high precision.

A preferred embodiment of the present invention provides a high voltage variable resistor device including a plurality of divided resistors for voltage detection, which are electrically connected in series between a high-voltage input terminal and a ground terminal, at least one of the plurality of divided resistors being a variable resistor, a voltage detection terminal that is electrically connected in the approximate middle of the plurality of the series-connected divided resistors, an insulation substrate, and one of a resistor for adjusting focus voltage and a resistor for adjusting screen voltage provided on the insulation substrate, wherein the variable resistor, the voltage detection terminal, the high-voltage input terminal, and the ground terminal are provided on the insulation substrate.

As a result of the divided resistor for voltage detection being provided on the insulation substrate on which the resistor for adjusting the focus voltage or the resistor for adjusting the screen voltage is provided, it is not necessary to assemble the divided resistor for voltage detection as a separate body, and thus, the manufacturing cost is reduced. In addition, as a result of at least one of the plurality of the divided resistors being a variable resistor, the division ratio is variable.

In the high voltage variable resistor device according to preferred embodiments of the present invention, as a result of electrically connecting the variable resistor for voltage detection between the voltage detection terminal and the high-voltage input terminal, a variable resistor for voltage detection may be provided on a side having a higher voltage than the detection output electrical potential.

The divided resistor for voltage detection, which is electrically connected between the voltage detection terminal and the ground terminal, is preferably a fixed resistor, which is another separate body.

The high voltage variable resistor device and the capacitor for high voltage are preferably housed in an insulation case.

According to preferred embodiments of the present invention, as a result of the divided resistor for voltage detection being provided on the insulation substrate on which the resistor for adjusting the focus voltage or the resistor for adjusting the screen voltage is provided, it is not necessary to assemble the divided resistor for voltage detection, which is another separate body, and the manufacturing cost is further reduced. As a result of at least one of the plurality of the divided resistors being a variable resistor, the division ratio can be finely adjusted with high precision. Since the division ratio is variable, unlike the case of the known high voltage variable resistor device, it is not necessary to increase the number of types of fixed resistors for each different division ratio of the divided resistor for voltage detection. Thus, a high voltage variable resistor device that is easily adaptable to a variety of specifications is obtained.

Other features, elements, steps, characteristics and advantages of the present invention will become more apparent from the following detailed description of preferred embodiments with reference to the attached drawings.

DETAILED DESCRIPTION OF PREFERRED EMBODIMENTS

Preferred embodiments of a high voltage variable resistor device according to the present invention will now be described below with reference to the attached drawings.

Figure 1:
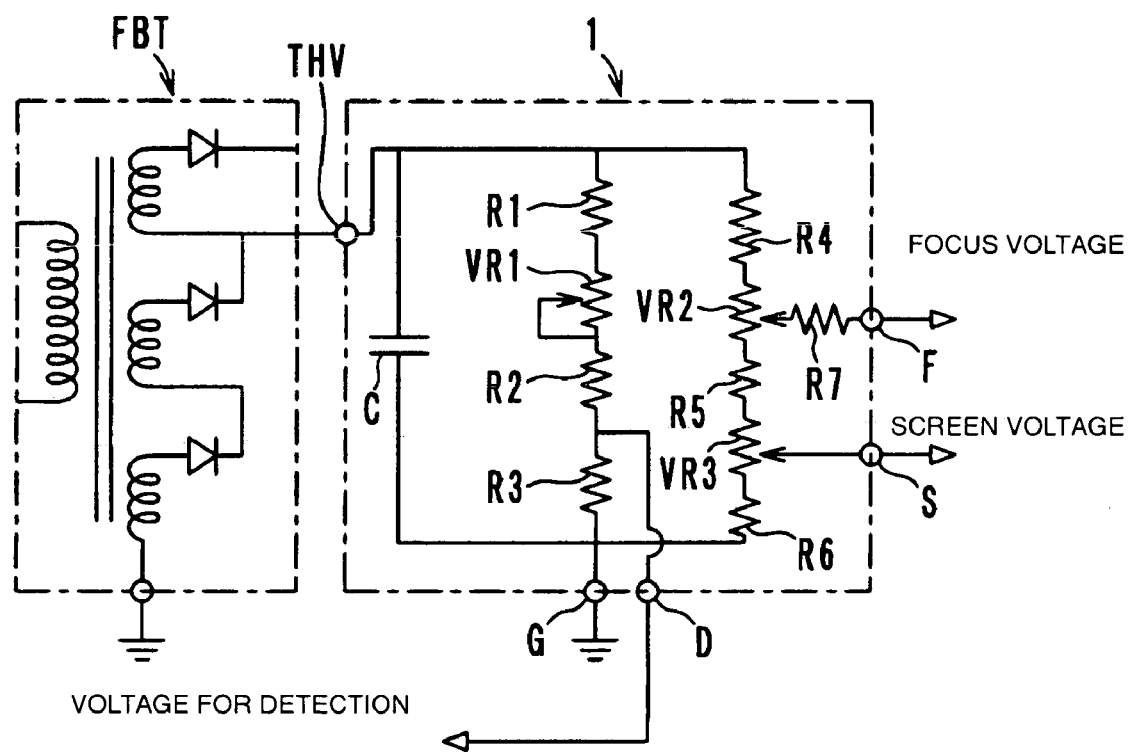
FIG. 1 is an electrical circuit diagram showing a first preferred embodiment of a high voltage variable resistor device according to the present invention.
Figure 2:
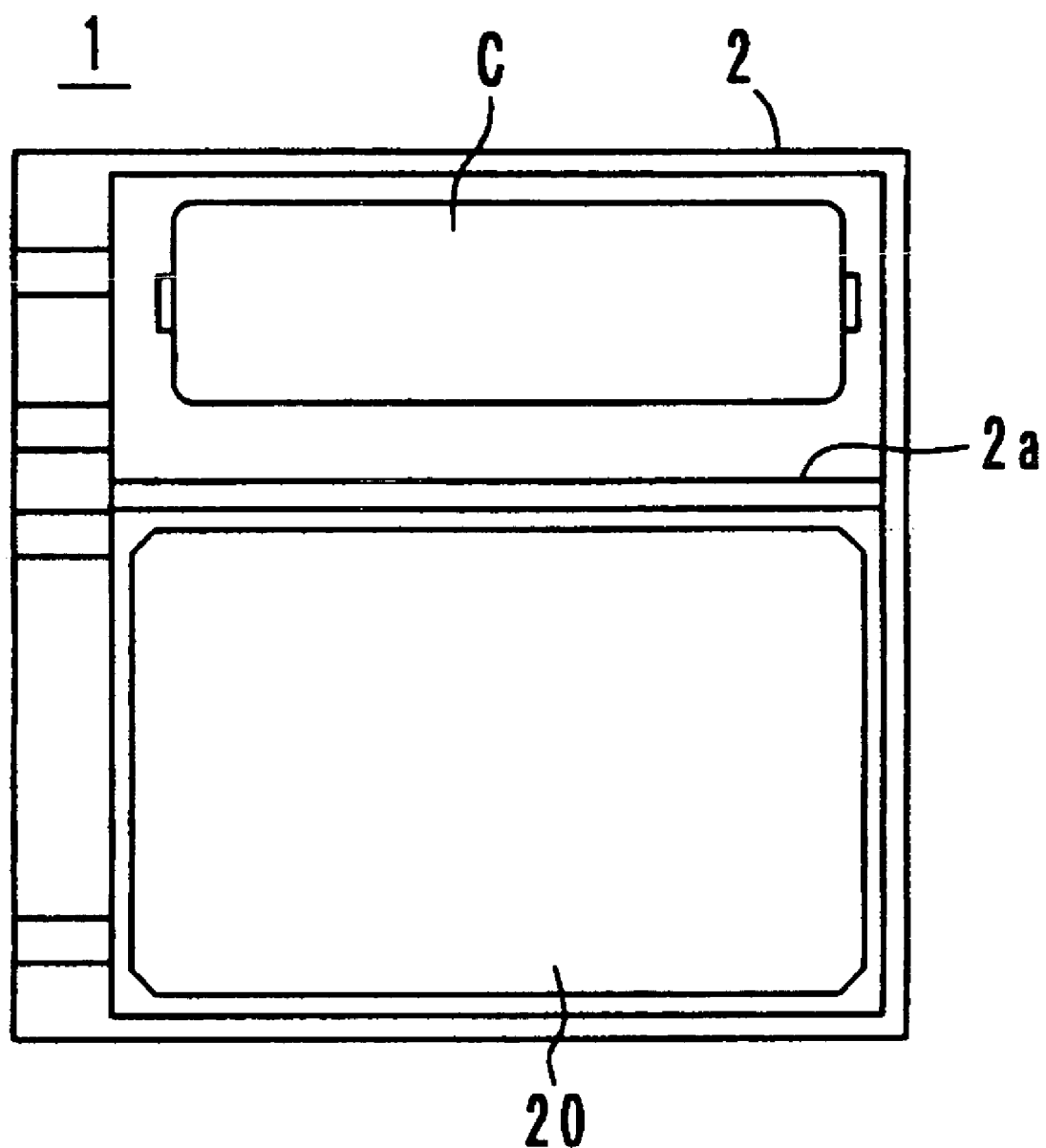
FIG. 2 is a back view of the high voltage variable resistor device shown in FIG. 1.
Figure 3:
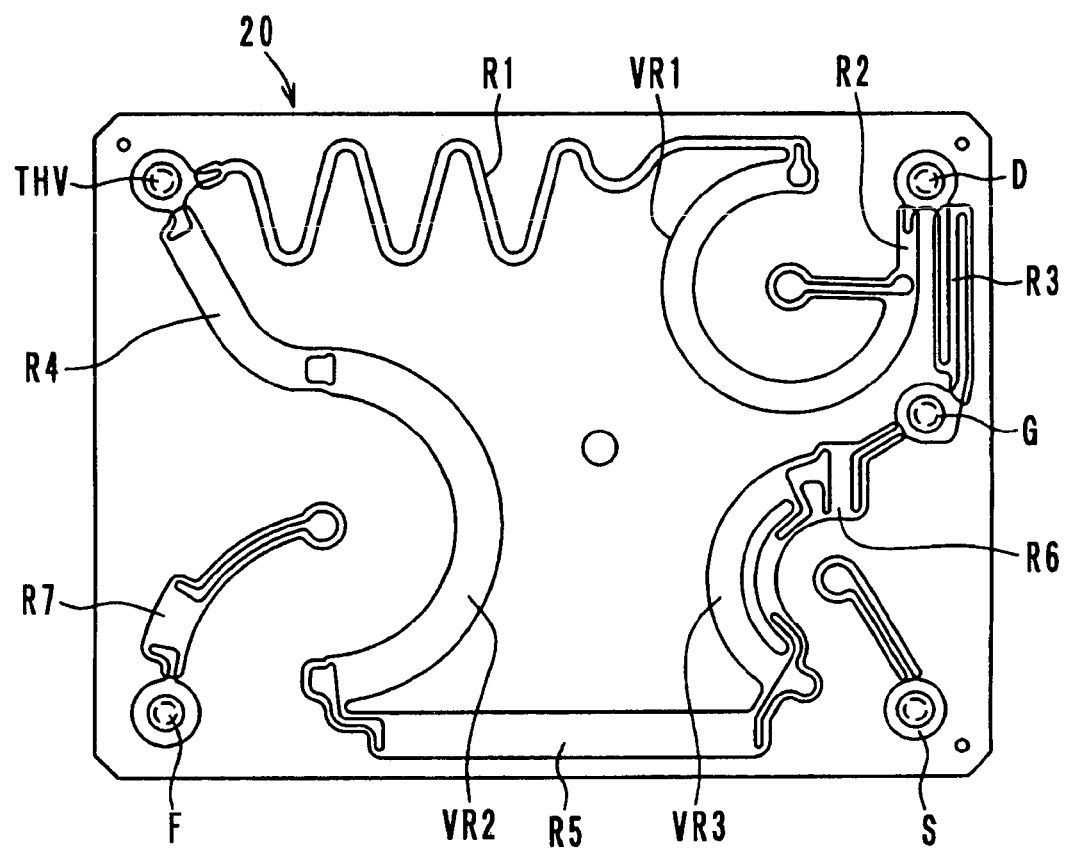
FIG. 3 is a plan view of an insulation substrate shown in FIG. 2.

First Preferred Embodiment, FIGS. 1 to 3

As shown in FIG. 1, a high voltage variable resistor device 1 directly receives an input voltage from a center tap on the secondary side of a flyback transformer FBT for supplying an anode voltage to a cathode-ray tube. However, an input voltage may be obtained from the output terminal of the flyback transformer FBT.

A series circuit defined by fixed resistors R4 to R6 and variable resistors VR2 and VR3 is connected between a high-voltage input terminal THV of the high voltage variable resistor device 1 and a ground terminal G. Also, a series circuit defined by fixed divided resistors R1 to R3 for voltage detection and a variable divided resistor VR1, and a capacitor C for high voltage are each connected therebetween. The intermediate terminal of the variable resistor VR2 for adjusting focus voltage is connected to a focus-voltage output terminal F via a fixed resistor R7. The intermediate terminal of the variable resistor VR3 for adjusting screen voltage is connected to a screen voltage output terminal S.

The fixed divided resistors R1 to R3 for voltage detection and the variable divided resistor VR1 are provided to detect variations of the anode voltage of the flyback transformer FBT. The voltage for detection, which is divided at the connection point of the fixed divided resistors R2 and R3 for voltage detection, is fed back from a voltage detection terminal D to a high-voltage generation source. The voltage for detection is usually set at about $\frac{1}{3000}$ to about $\frac{1}{2000}$ of the anode voltage. The variable divided resistor VR1 for voltage detection, together with the fixed divided resistors R1 and R2, is electrically connected between the high-voltage input terminal THV and the voltage detection terminal D. That is, the variable divided resistor VR1 for voltage detection is provided on a side with a higher voltage than the detection output electrical potential.

The fixed resistor R4 is set such that a high voltage that is greater than or equal to about 60% of the input voltage is applied thereto. The capacitor C is preferably a screen correcting capacitor for correcting the distortion of the screen of the television receiver.

The high voltage variable resistor device 1 preferably has a configuration as shown in FIG. 2. That is, a division wall 2a is provided inside of an insulation case 2 made of synthetic resin and having one open surface. In one of the housing sections, an insulation substrate 20 on which the variable divided resistor VR1 for voltage detection, the resistor variable resistor VR2 for adjusting the focus voltage, the variable resistor VR3 for adjusting the screen voltage, and other suitable components, are provided, is housed and fixed. In the other housing section, the high voltage capacitor C is housed and fixed.

As shown in FIG. 3, on the surface of the insulation substrate 20, the film resistors of the fixed divided resistors R1 to R3 and the variable divided resistor VR1 for voltage detection, the fixed resistors R4 to R7, the variable resistor VR2 for adjusting the focus voltage, and the variable resistor VR3 for adjusting the screen voltage are provided. Furthermore, on the insulation substrate 20, the high-voltage input terminal THV, the voltage detection terminal D, the focus-voltage output terminal F, the screen voltage terminal S, and the ground terminal G are provided.

The fixed divided resistor R1 has a meandering pattern and has a high resistance. One end of the fixed divided resistor R1 is connected to the high-voltage input terminal THV, and the other end is connected to one end of the variable divided resistor VR1. The variable divided resistor VR1 has an arc pattern, and its other end is connected to one end of the fixed divided resistor R2. The other end of the fixed divided resistor R2 is connected to the voltage detection terminal D. The fixed divided resistor R3 having a wide width pattern with a low resistance value is connected between the voltage detection terminal D and the ground terminal G.

One end of the fixed resistor R4 is connected to the high-voltage input terminal THV, and its other end is connected to one end of the variable resistor VR2 for adjusting the focus voltage. The variable resistor VR2 for adjusting the focus voltage has an arc pattern, and its other end is connected to one end of the fixed resistor R5. The intermediate terminal of the variable resistor VR2 for adjusting the focus voltage is connected to one end of the fixed resistor R7. The other end of the fixed resistor R7 is connected to a focus-voltage output terminal F. The other end of the fixed resistor R5 is connected to one end of the variable resistor VR3 for adjusting the screen voltage. The variable resistor VR3 for adjusting the screen voltage has an arc pattern, and its other end is connected to one end of the fixed resistor R6.

The intermediate terminal of the variable resistor VR3 for adjusting the screen voltage is connected to the screen voltage output terminal S. The other end of the fixed divided resistor R6 is connected to the ground terminal G.

Although not shown, in the front-end section of the insulation case 2 opposing the insulation substrate 20, a rotation shaft having a slider that slides on the film resistor of each of the variable divided resistor VR1, the variable resistor VR2 for adjusting the focus voltage, and the variable resistor VR3 for adjusting the screen voltage is axially supported. That is, the variable resistors VR1, VR2, and VR3 are defined by the insulation substrate 20, the rotation shaft having a slider, and other suitable components.

In the high voltage variable resistor device 1 having the above-described configuration, the fixed divided resistors R1 to R3 and the variable divided resistor VR1 for voltage detection are provided on the insulation substrate 20 on which the variable resistor VR2 for adjusting the focus voltage and the variable resistor VR3 for adjusting the screen voltage are provided. Therefore, it is not necessary to assemble a divided resistor for voltage detection as a separate body, and thus, the manufacturing cost is reduced.

Since one of the plurality of divided resistors for voltage detection is made to be the variable resistor VR1, the division ratio can be finely adjusted with high precision by changing the resistance value of the variable resistor VR1. More specifically, the division ratio of the high voltage variable resistor device 1 is $R3/(R1+VR1+R2+R3)$, and a predetermined division ratio is obtained by adjusting the resistance value of the variable resistor VR1. For example, the division ratio when R1=360 MΩ, VR1=(variable from 0 to 67 MΩ), R2=10 MΩ, and R3=220 KΩ can be finely adjusted from about $1/1682$ to about $1/1987$. Since the resistance value of the denominator of the calculation equation is finely adjusted, the adjustment sensitivity is high. It is noted that the fixed divided resistor R2 does not always have to be provided.

Figure 6:
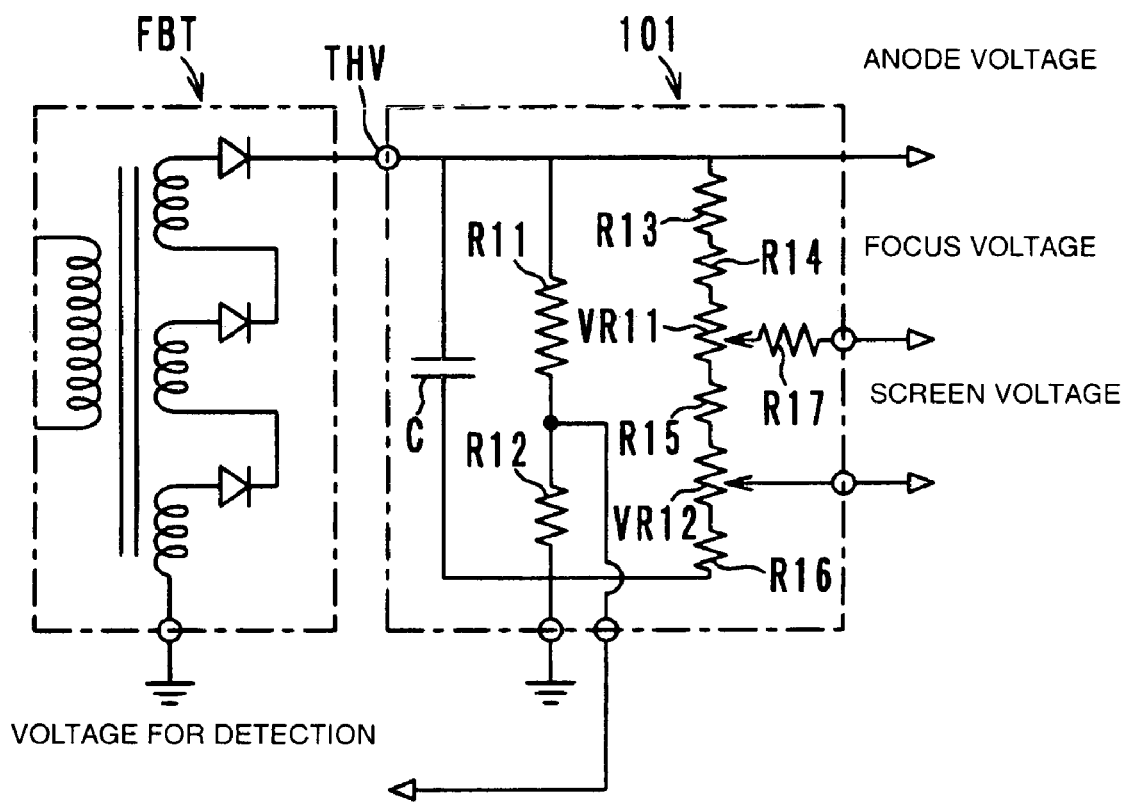
FIG. 6 is an electrical circuit diagram showing a known high voltage variable resistor device.
Figure 7:
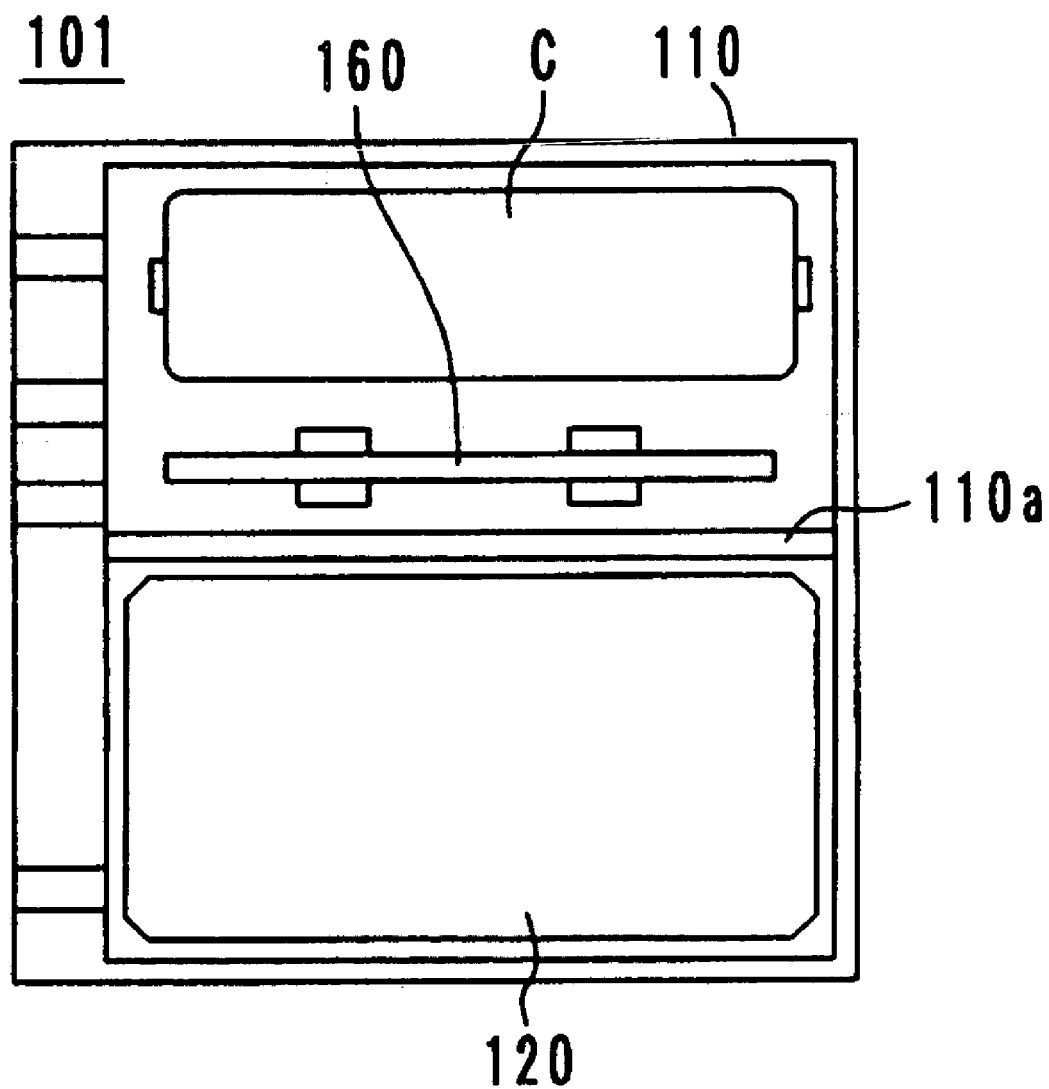
FIG. 7 is a back view of the high voltage variable resistor device shown in FIG. 6.
Figure 8:
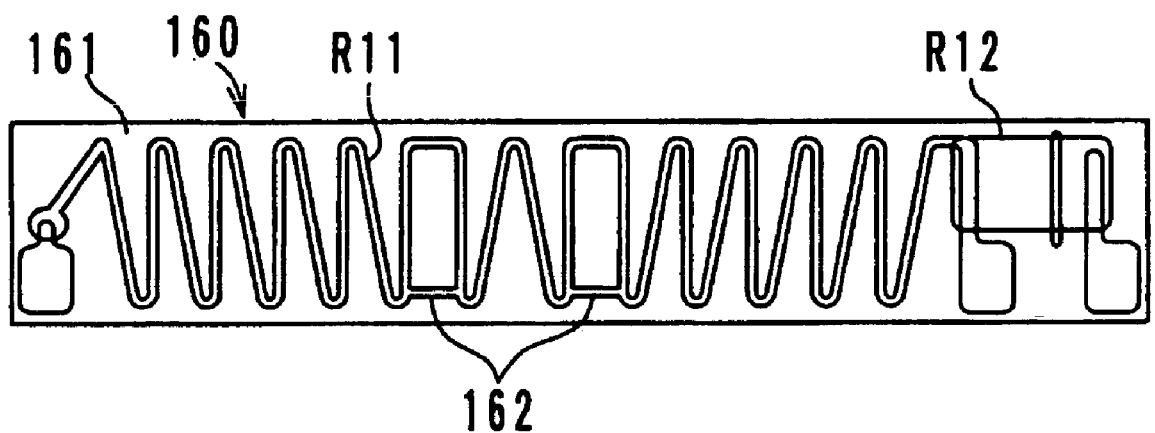
FIG. 8 is a front view of a fixed resistor in the high voltage variable resistor device shown in FIG. 7.

Since the division ratio is variable, unlike the case of the known high voltage variable resistor device 101 shown in FIGS. 6 to 8, it is not necessary to increase the number of types of fixed resistors 160 for each different division ratio of the divided resistor for voltage detection. Thus, it is possible to obtain the high voltage variable resistor device 1 that is easily adaptable to a variety of specifications.

Figure 4:
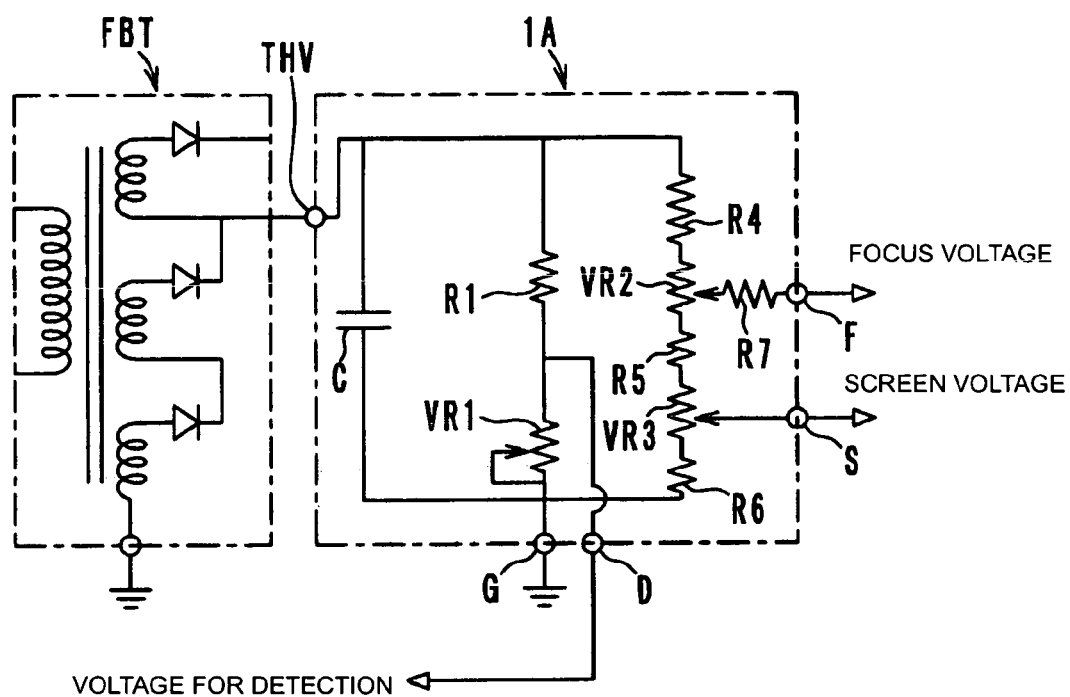
FIG. 4 is an electrical circuit diagram showing a second preferred embodiment of the high voltage variable resistor device according to the present invention.

Second Preferred Embodiment, FIG. 4

As shown in FIG. 4, a high voltage variable resistor device 1A has a configuration that is identical to that of the high voltage variable resistor device 1 of the above-described first preferred embodiment except for a fixed divided resistor R1 and a variable divided resistor VR1 for voltage detection.

The fixed divided resistor R1 and the variable divided resistor VR1 for voltage detection are provided to detect variations of the anode voltage of a flyback transformer FBT. The detection voltage, which is divided at the connection point of the fixed divided resistor R1 and the variable divided resistor VR1, is fed back from a voltage detection terminal D to a high-voltage generation source. The variable divided resistor VR1 for voltage detection is electrically connected between the voltage detection terminal D and a ground terminal G. That is, the variable divided resistor VR1 for voltage detection is provided on a side with a lower voltage than the detection output electrical potential.

Although not shown, the fixed divided resistor R1 and the variable divided resistor VR1 for voltage detection are provided on an insulation substrate on which a variable resistor VR2 for adjusting focus voltage and a variable resistor VR3 for adjusting screen voltage are provided. Therefore, for the high voltage variable resistor device 1A, it is not necessary to assemble a divided resistor for voltage detection, which is another separate body, and the manufacturing cost is reduced.

Since one of the plurality of the divided resistors for voltage detection is defined by the variable resistor VR1, the division ratio can be finely adjusted with high precision by changing the resistance value the variable resistor VR1. More specifically, the division ratio of the high voltage variable resistor device 1A is $VR1/(R1+VR1)$, and a predetermined division ratio is obtained by adjusting the resistance value of the variable resistor VR1. For example, the division ratio when R1=360 MΩ and VR1=(variable from 100 to 300 KΩ) can be finely adjusted from about $1/1333$ to about $1/4000$. As a result, the adjustment sensitivity is decreased, but the adjustment range is increased.

Figure 5:
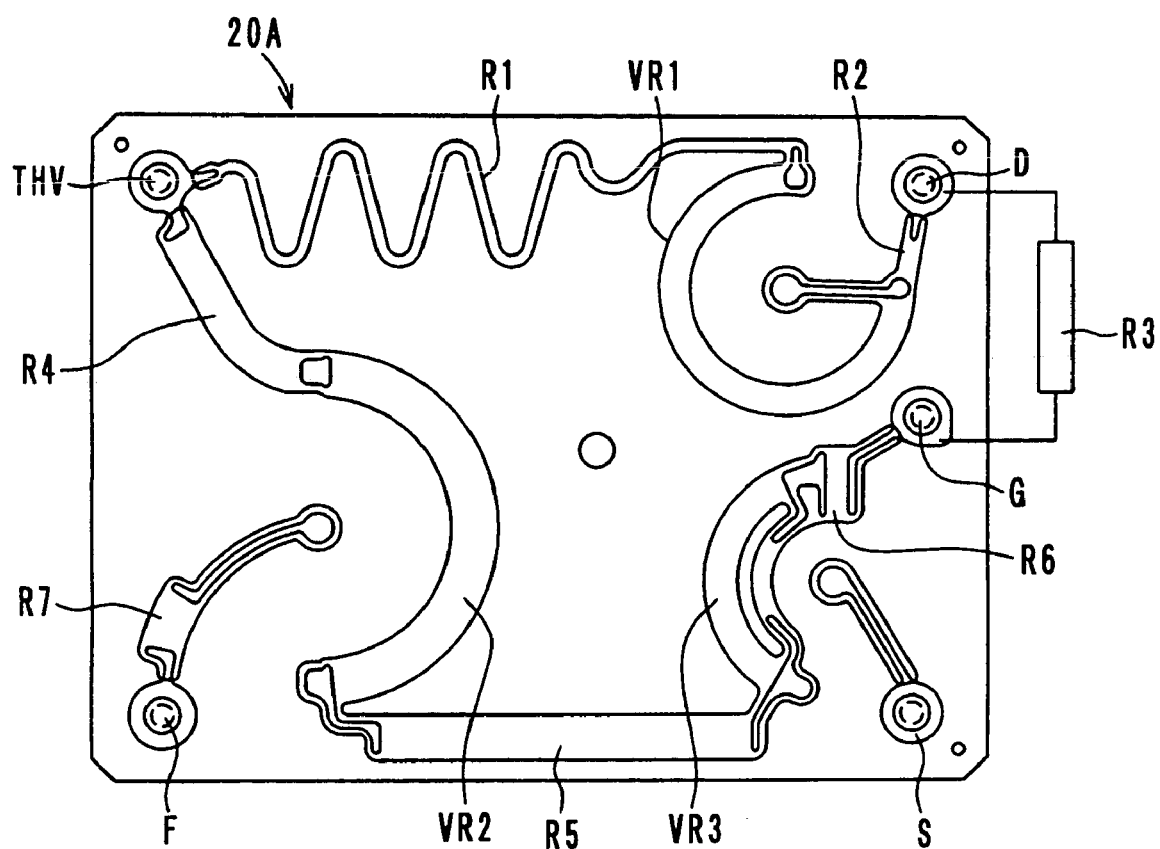
FIG. 5 is a plan view of an insulation substrate showing a third preferred embodiment of the high voltage variable resistor device according to the present invention.

Third Preferred Embodiment, FIG. 5

A high voltage variable resistor device according to a third preferred embodiment of the present invention includes an insulation substrate 20A shown in FIG. 5. That is, the high voltage variable resistor device according to the third preferred embodiment has a configuration that is identical to that of the high voltage variable resistor device 1 of the first preferred embodiment except for a fixed divided resistor R3 for voltage detection. The electrical circuit configuration of the third preferred embodiment is identical to that of the high voltage variable resistor device 1 of the first preferred embodiment.

On the surface of the insulation substrate 20A, film resistors of fixed divided resistors R1 and R2 and a variable divided resistor VR1 for voltage detection, fixed resistors R4 to R7, a variable resistor VR2 for adjusting focus voltage, and a variable resistor VR3 for adjusting screen voltage are provided. The insulation substrate 20A is provided with a high-voltage input terminal THV, a voltage detection terminal D, a focus-voltage output terminal F, a screen voltage terminal S, and a ground terminal G. A fixed resistor R3 having a low resistance, which is another separate body, is connected between the voltage detection terminal D and the ground terminal G.

The high voltage variable resistor device having the above-described configuration exhibits operational advantages identical to those of the first preferred embodiment.

Other Preferred Embodiments

The present invention is not limited to the above-described preferred embodiments, and can be modified within the spirit and scope of the present invention. For example, a high voltage variable resistor device in which the screen correcting capacitor C is not incorporated may also be provided. Although not shown, a high voltage variable resistor device in which a coupling capacitor for dynamic focus for inputting a parabolic waveform voltage, a smoothing capacitor, and other suitable components, are mounted may also be used.

Furthermore, the insulation substrate 20 may be such that one of the resistor VR2 for adjusting the focus voltage and the resistor VR3 for adjusting the screen voltage is provided.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A high voltage variable resistor device, comprising:
   a plurality of divided resistors for voltage detection, which are electrically connected in series between a high-voltage input terminal and a ground terminal, at least one of said plurality of divided resistors being a variable resistor;
   a voltage detection terminal that is electrically connected in an approximate middle region of the plurality of the series-connected divided resistors;
   an insulation substrate; and
   one of a resistor for adjusting focus voltage and a resistor for adjusting screen voltage provided on said insulation substrate; wherein
   said voltage detection terminal, said high-voltage input terminal, and said ground terminal are provided on said insulation substrate; and
   each of the plurality of divided resistors is provided on the insulation substrate.

2. The high voltage variable resistor device according to claim 1, wherein said variable resistor for voltage detection is electrically connected between said voltage detection terminal and said high-voltage input terminal.

3. The high voltage variable resistor device according to claim 1, wherein at least two of the plurality of divided resistors for voltage detection are electrically connected between said voltage detection terminal and said high-voltage input terminal, and one of the at least two of the plurality of said divided resistors is a variable resistor.

4. The high voltage variable resistor device according to claim 3, wherein a divided resistor for voltage detection of said plurality of divided resistors is electrically connected between said voltage detection terminal and said ground terminal and is a fixed resistor defined by a separate body.

5. The high voltage variable resistor device according to claim 1, further comprising a high voltage capacitor, wherein the high voltage variable resistor device and said high voltage capacitor are housed in an insulation case.

6. The high voltage variable resistor device according to claim 1, wherein the plurality of divided resistors include the at least one variable resistor and at least one fixed resistor.

7. The high voltage variable resistor device according to claim 6, wherein the at least one variable resistor is defined by an arc pattern disposed on a surface of said insulation substrate.

8. The high voltage variable resistor device according to claim 6, wherein said at least one fixed resistor is defined by a meandering pattern disposed on a surface of said insulation substrate and having a high resistance.

9. The high voltage variable resistor device according to claim 1, further comprising an insulation case including two sections, wherein said insulation substrate is disposed in one of the two sections of the insulation case.

10. The high voltage variable resistor device according to claim 5, wherein the insulation case includes two sections, said high voltage variable resistor device is disposed in one of said two sections of the insulation case and said high voltage capacitor is disposed in the other of said two sections of the insulation case.

* * * * *